United States Patent
Nam et al.

(10) Patent No.: US 8,890,167 B2
(45) Date of Patent: Nov. 18, 2014

(54) ARRAY SUBSTRATE FOR DISPLAY DEVICE INCLUDING SIGNAL LINES WITH REDUCED RESISTANCE

(75) Inventors: Seung-Hee Nam, Gyeonggi-do (KR); Soon-Sung Yoo, Gyeonggi-do (KR); Tae-Hyoung Moon, Gyeonggi-do (KR); Tae-Joon Song, Gyeonggi-do (KR); Kyu-Hwang Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 63 days.

(21) Appl. No.: 13/587,028

(22) Filed: Aug. 16, 2012

(65) Prior Publication Data

US 2013/0214278 A1    Aug. 22, 2013

(30) Foreign Application Priority Data

Aug. 19, 2011 (KR) .................. 10-2011-0082808
Jun. 25, 2012 (KR) .................. 10-2012-0067842

(51) Int. Cl.
  *H01L 27/14* (2006.01)
  *H01L 27/12* (2006.01)
  *H01L 27/32* (2006.01)

(52) U.S. Cl.
  CPC ........ *H01L 27/1214* (2013.01); *H01L 27/1259* (2013.01); *H01L 27/124* (2013.01); *H01L 27/1288* (2013.01); *H01L 27/3279* (2013.01)
  USPC .............................................. 257/72; 257/59

(58) Field of Classification Search
  USPC ....................................... 257/59, 72
  See application file for complete search history.

(56) References Cited

U.S. PATENT DOCUMENTS

| | | | |
|---|---|---|---|
| 2004/0109121 A1* | 6/2004 | Cho et al. ....................... | 349/141 |
| 2007/0034954 A1* | 2/2007 | Cho et al. ....................... | 257/347 |
| 2009/0050894 A1* | 2/2009 | Park et al. ....................... | 257/72 |
| 2010/0265447 A1* | 10/2010 | Seo et al. ....................... | 349/141 |
| 2011/0310057 A1* | 12/2011 | Wang .............................. | 345/174 |
| 2012/0228619 A1* | 9/2012 | Youn et al. ....................... | 257/59 |

\* cited by examiner

*Primary Examiner* — Bilkis Jahan
(74) *Attorney, Agent, or Firm* — Morgan, Lewis & Bockius LLP

(57) ABSTRACT

An array substrate for a display device and manufacturing method thereof is disclosed. The device comprises: a substrate; a gate line formed on the substrate along a first direction; a data line formed over the substrate along a second direction, wherein the data line and the gate line cross each other to define a pixel region; a thin film transistor formed in the pixel region, and having a gate electrode connected to the gate line, a source electrode connected to the data line, and a drain electrode; a pixel electrode formed in the pixel region and connected to the drain electrode; a first auxiliary gate pattern formed over the gate line and contacting the gate line; and a first auxiliary data pattern formed over the data line and contacting the data line.

16 Claims, 15 Drawing Sheets

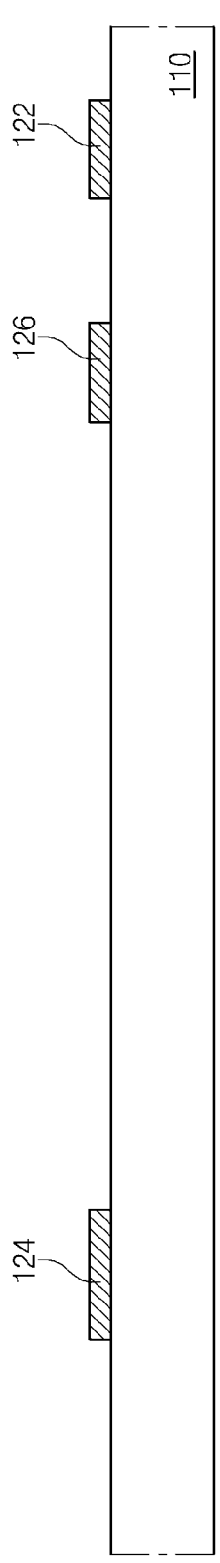
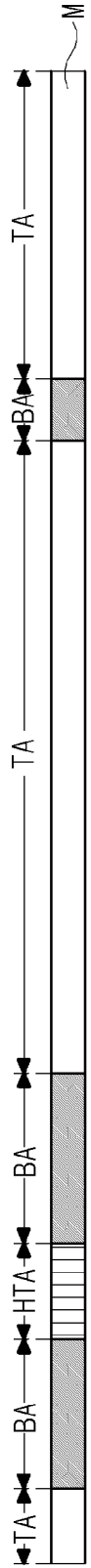
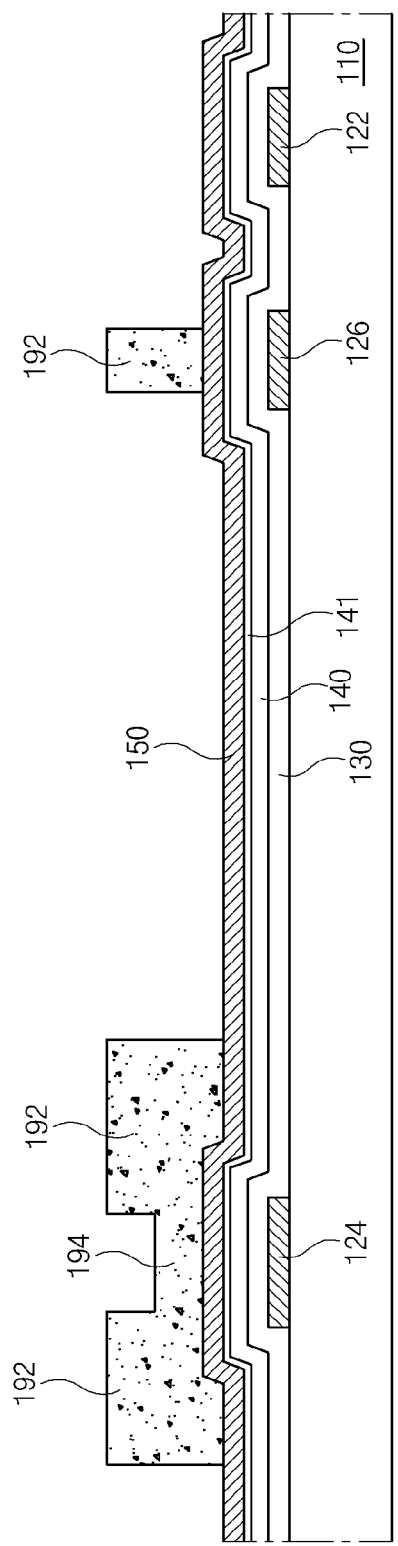
FIG. 6A
FIG. 6B

ARRAY SUBSTRATE FOR DISPLAY DEVICE INCLUDING SIGNAL LINES WITH REDUCED RESISTANCE

The application claims the benefit of Korean Patent Application Nos. 10-2011-0082808 filed in Korea on Aug. 19, 2011 and 10-2012-0067842 filed in Korea on Jun. 25, 2012, which are hereby incorporated by reference for all purposes as if fully set forth herein.

BACKGROUND

1. Field of the Disclosure

The disclosure relates to an array substrate for a display device, and more particularly, to an array substrate for a display device including a thin film transistor and a method of manufacturing the same.

2. Discussion of the Related Art

With rapid development of information technologies, various display devices for displaying images have been requested. Flat panel display (FPD) devices such as a liquid crystal display (LCD) device, a plasma display panel (PDP) device and an organic light emitting diode (OLED) device have been suggested.

Among the FPD devices, the LCD device has been widely used for its superiorities of small size, light-weight, thin profile and low power consumption.

An active matrix type display device, which includes pixels arranged in a matrix form and switching elements for controlling on/off the respective pixels, have been widely used. The active matrix type display device includes an array substrate, on which gate lines, data lines, switching elements and pixel electrodes are formed. The array substrate will be described hereinafter with reference to accompanying drawings.

FIG. 1 is a plane view of illustrating an array substrate for a display device according to the related art.

In FIG. 1, a gate line 22 and a data line 52 cross each other to define a pixel region P. A thin film transistor T is connected to the gate line 22 and the data line 52.

The thin film transistor T includes a gate electrode 24, an active layer 42, a source electrode 54 and a drain electrode 56. The gate electrode 24 is connected to the gate line 22, the source electrode 54 is connected to the data line 52, and the drain electrode 56 is spaced apart from the source electrode 54. The active layer 52 is exposed between the source electrode 54 and the drain electrode 56, and the exposed portion of the active layer 52 becomes a channel of the thin film transistor T.

A pixel electrode 72 is formed in the pixel region P and is connected to the drain electrode 56 of the thin film transistor T through a drain contact hole 62.

A cross-sectional structure of an array substrate for a display device according to the related art will be described with reference to FIG. 2.

FIG. 2 is a cross-sectional view of illustrating an array substrate for a display device according to the related art and corresponds to a cross-section taken along the line II-II of FIG. 1.

In FIG. 2, a gate line 22 and a gate electrode 24 connected to the gate line 22 are formed on a substrate 10, and a gate insulating layer 30 is formed on the gate line 22 and the gate electrode 24.

An active layer 42 of intrinsic silicon is formed on the gate insulating layer 30 over the gate electrode 24, and ohmic contact layers 44 of impurity-doped silicon are formed on the active layer 42.

A data line 52, a source electrode 54 and a drain electrode 56 are formed on the ohmic contact layer 44. A passivation layer 60 is formed on the data line 52, the source electrode 54 and the drain electrode 56. The passivation layer 60 includes a drain contact hole 62 exposing the drain electrode 56.

A pixel electrode 72 is formed on the passivation layer 60 and is connected to the drain electrode 56 through the drain contact hole 62.

Recently, as the display devices have been requested to have large sizes and high definitions, lengths of signal lines such as the gate line 22 and the data line 52 become longer. Thus, resistances of the signal lines increases, and signal delays are caused. In addition, since driving speeds are heightened, loads applied to the signal lines are raised. To solve these problems, various attempts have been made.

For example, the resistance of the signal line can be decreased by widening a width of the signal line. In this case, since an area of the pixel region is decreased, an aperture ratio is reduced and brightness is lowered. Here, the brightness may be raised by increasing an amount of provided light. However, power consumption is lifted, and light efficiency is lowered.

Alternatively, the resistance of the signal line may be decreased by thickening a thickness of the signal line. However, the signal line is formed by depositing a metallic material to form a metallic layer and selectively patterning the metallic layer. Thus, to thicken the thickness of the signal line, the metallic layer should be thickened, and an amount of the metallic material for deposition is increased. Moreover, an amount of an etchant for patterning the metallic layer is increased. Accordingly, the manufacturing costs of the array substrate are raised.

Meanwhile, certain metallic materials have poor properties in contact with the substrate, and when it is formed to be thick, it may be cracked or peeled off from the substrate. Therefore, there is a limitation on increasing the thickness of the signal line.

SUMMARY OF THE INVENTION

Accordingly, the present invention is directed to an array substrate for a display device and a method of manufacturing the same that substantially obviate one or more of the problems due to limitations and disadvantages of the related art.

An advantage of the present invention is to provide an array substrate for a display device and a method of manufacturing the same that reduce the resistance of the signal lines.

Another advantage of the present invention is to provide an array substrate for a display device and a method of manufacturing the same that improve the aperture ratio and brightness.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of embodiments of the invention, as embodied and broadly described, an array substrate for a display device includes: a substrate; a gate line formed on the substrate along a first direction; a data line formed over the substrate along a second direction, wherein the data line and the gate line cross each other to define a pixel region; a thin film transistor formed in the pixel region, and having a gate electrode connected to the gate line, a source electrode connected to the data line, and a drain electrode; a pixel electrode formed in the pixel region and connected to the drain electrode; a first auxiliary gate pattern formed over the gate line and contacting the gate line; and a first auxiliary data pattern formed over the data line and contacting the data line.

Furthermore, the above array substrate for a display device may further comprise: a gate insulating layer covering the gate line and the gate electrode, and being below the data line; a passivation layer formed on the data line and the gate insulating layer; a first contact hole formed in the passivation layer and the gate insulating layer, and exposing the gate line along the first direction; and a second contact hole formed in the passivation layer, and exposing the data line along the second direction, wherein the first auxiliary gate pattern may be formed in the first contact hole; and the first auxiliary data pattern may be formed in the second contact hole.

Moreover, the above array substrate for a display device may further comprise a drain contact pattern, wherein the passivation layer may be further formed on the drain electrode and comprise a drain contact hole, the drain contact pattern may be formed in the drain contact hole and contact the drain electrode, and the pixel electrode may cover and contact the drain contact pattern.

Further, the above array substrate for a display device may further comprise: a second auxiliary gate pattern formed on the first auxiliary gate pattern to cover, contact and protect the first auxiliary gate pattern; and a second auxiliary data pattern formed on the first auxiliary data pattern to cover, contact and protect the first auxiliary data pattern.

Furthermore, in the above array substrate for a display device, the second auxiliary gate pattern and the second auxiliary data pattern may be formed of the same material as the pixel electrode.

Moreover, in the above array substrate for a display device, the first auxiliary gate pattern and the first auxiliary data pattern may be formed by a plating method.

Further, in the above array substrate for a display device, the drain contact pattern, the first auxiliary gate pattern and the first auxiliary data pattern may be formed by a plating method.

Furthermore, in the above array substrate for a display device, the first auxiliary gate pattern and the first auxiliary data pattern may be formed of copper, chromium or nickel.

Moreover, in the above array substrate for a display device, the drain contact pattern, the first auxiliary gate pattern and the first auxiliary data pattern may be formed are formed of copper, chromium or nickel.

Further, in the above array substrate for a display device, the first auxiliary data pattern may be formed in one-united body along the data line.

Furthermore, in the above array substrate for a display device, the first auxiliary data pattern may be formed in one-united body along the data line.

Moreover, the above array substrate for a display device may further comprise: a common line formed between adjacent gate lines and parallel to the gate line, wherein the gate insulating layer may further cover the common line; a capacitor electrode formed over the common line, the capacitor electrode and the common line overlapping each other form a storage capacitor with the gate insulating layer interposed therebetween; and a capacitor contact pattern, wherein the passivation layer may be further formed on the capacitor electrode and comprise a capacitor contact hole, the capacitor contact pattern may be formed in the capacitor contact hole and contact the capacitor electrode, and the pixel electrode may cover and contact the capacitor contact pattern.

Further, in the above array substrate for a display device, the drain contact pattern, the first auxiliary gate pattern, the first auxiliary data pattern and the capacitor contact pattern may be formed by a plating method.

Moreover, in the above array substrate for a display device, the drain contact pattern, the first auxiliary gate pattern, the first auxiliary data pattern and the capacitor contact pattern may be formed of copper, chromium or nickel.

In another aspect, a method of manufacturing an array substrate for a display device include: forming a gate line on a substrate along a first direction, and a gate electrode on the substrate, wherein the gate electrode extends from the gate line; forming a gate insulating layer covering the gate line and the gate electrode; forming an active layer on the gate insulating layer over the gate electrode, ohmic contact layers on the active layer; forming a data line along a second direction on the gate insulating layer, and a source electrode and a drain electrode on the ohmic contact layers, wherein the data line and the gate line cross each other to define a pixel region, the source electrode extends from the data line, and the drain electrode is spaced apart from the source electrode over the gate electrode; forming a first auxiliary gate pattern to contact the gate line, and a first auxiliary data pattern to contact the data line; and forming a pixel electrode in the pixel region and connected to the drain electrode.

Further, the above method may further comprise: forming a passivation layer on the data line, the source electrode and the drain electrode; and forming a first contact hole in the passivation layer and the gate insulating layer to expose the gate line, and a second contact hole in the passivation layer to expose the data line, wherein the first auxiliary gate pattern may be formed in the first contact hole, and the first auxiliary data pattern may be formed in the second contact hole Furthermore, the above method may further comprise: forming a drain contact hole in the passivation layer to expose the drain electrode, and forming a drain contact pattern in the drain contact hole to contact the drain electrode.

Moreover, in the step of forming a pixel electrode, a second auxiliary gate pattern may be formed on the first auxiliary gate pattern to cover and contact the first auxiliary gate pattern, and a second auxiliary data pattern may be formed on the first auxiliary data pattern to cover and contact the first auxiliary data pattern.

Further, in the above method, the second auxiliary gate pattern and the second auxiliary data pattern may be formed of the same material as the pixel electrode.

Furthermore, in the step of forming a gate line, a common line may be formed between adjacent gate lines and parallel to the gate line; in the step of forming a gate insulating layer, the gate insulating layer may further cover the common line; in the step of forming an active layer, a capacitor electrode may be formed over the common line, and the capacitor electrode and the common line overlapping each other may form a storage capacitor with the gate insulating layer interposed therebetween; in the step of forming a drain contact hole, a capacitor contact hole may be formed in the passivation layer to expose the capacitor electrode; in the forming a first auxiliary gate pattern, a capacitor contact pattern may be formed in the capacitor contact hole to contact the capacitor electrode; and in the forming a pixel electrode, the pixel electrode may further cover and contact the capacitor contact pattern.

Moreover, in the above method, the first auxiliary gate pattern and the first auxiliary data pattern may be formed by a plating method.

Further, in the above method, the drain contact pattern, the first auxiliary gate pattern and the first auxiliary data pattern may be formed by a plating method.

Moreover, in the above method, the capacitor contact pattern, the drain contact pattern, the first auxiliary gate pattern and the first auxiliary data pattern may be formed by a plating method.

Furthermore, in the above method, the first auxiliary gate pattern and the first auxiliary data pattern may be formed of copper, chromium or nickel.

Further, in the above method, the drain contact pattern, the first auxiliary gate pattern and the first auxiliary data pattern may be formed of copper, chromium or nickel.

Moreover, in the above method, the capacitor contact pattern, the drain contact pattern, the first auxiliary gate pattern and the first auxiliary data pattern may be formed of copper, chromium or nickel.

Further, in the above method, the first auxiliary data pattern may be formed in one-united body along the data line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 6A to 6F are cross-sectional views of illustrating an array substrate in respective steps of the method of manufacturing the same according to the exemplary embodiment of the present invention and correspond to the lines VI-VI of FIGS. 5A to 5D;

DETAILED DESCRIPTION OF THE PREFERRED EMBODIMENTS

Reference will now be made in detail to embodiments of the present invention, examples of which are illustrated in the accompanying drawings.

Figure 1:
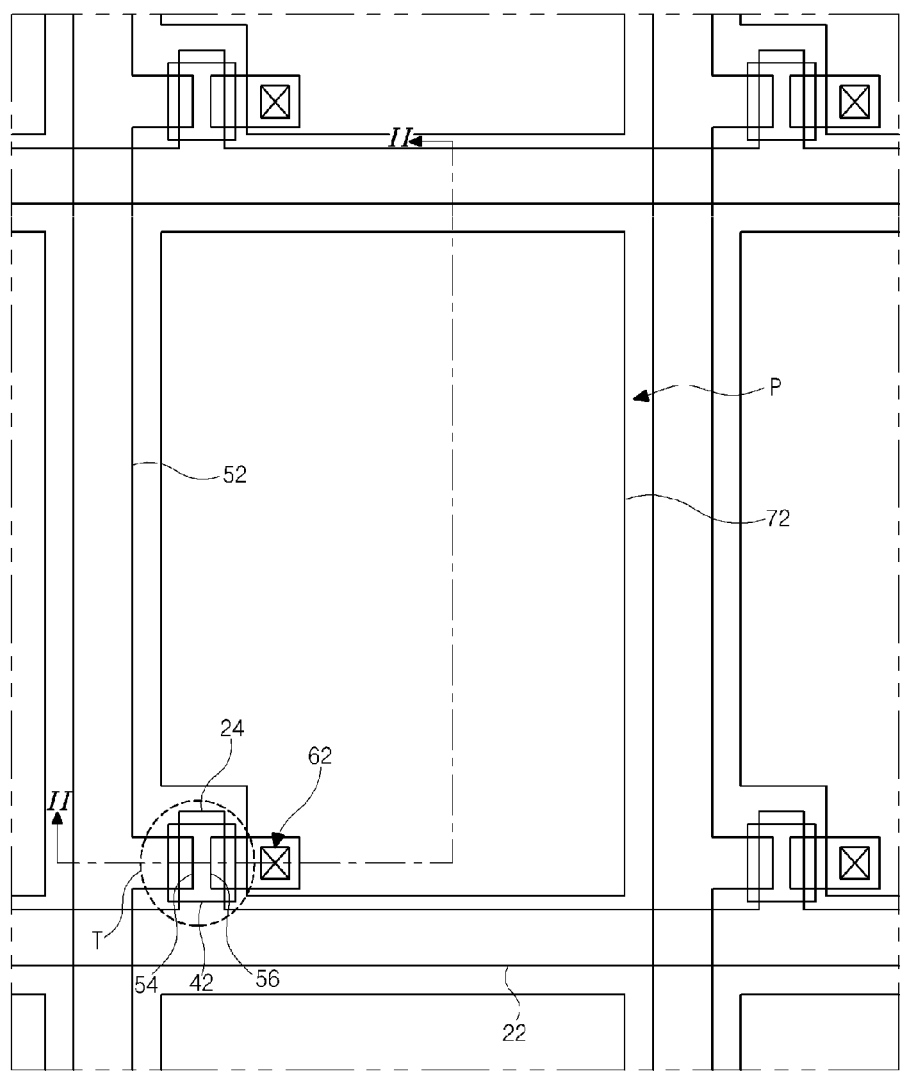
FIG. 1 is a plane view of illustrating an array substrate for a display device according to the related art.
Figure 2:
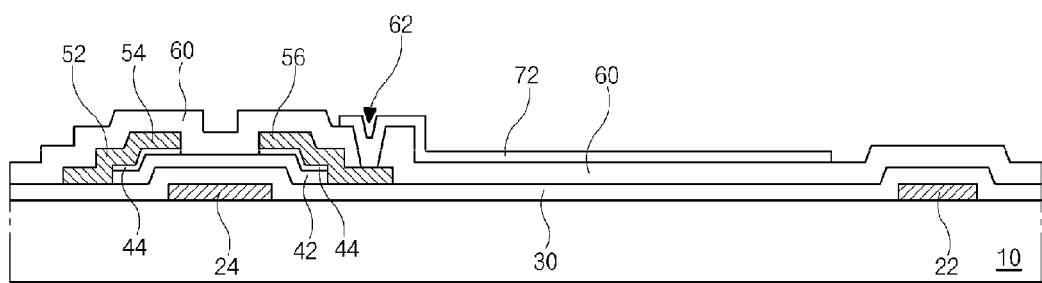
FIG. 2 is a cross-sectional view of illustrating an array substrate for a display device according to the related art and corresponds to a cross-section taken along the line II-II of FIG. 1.
Figure 3:
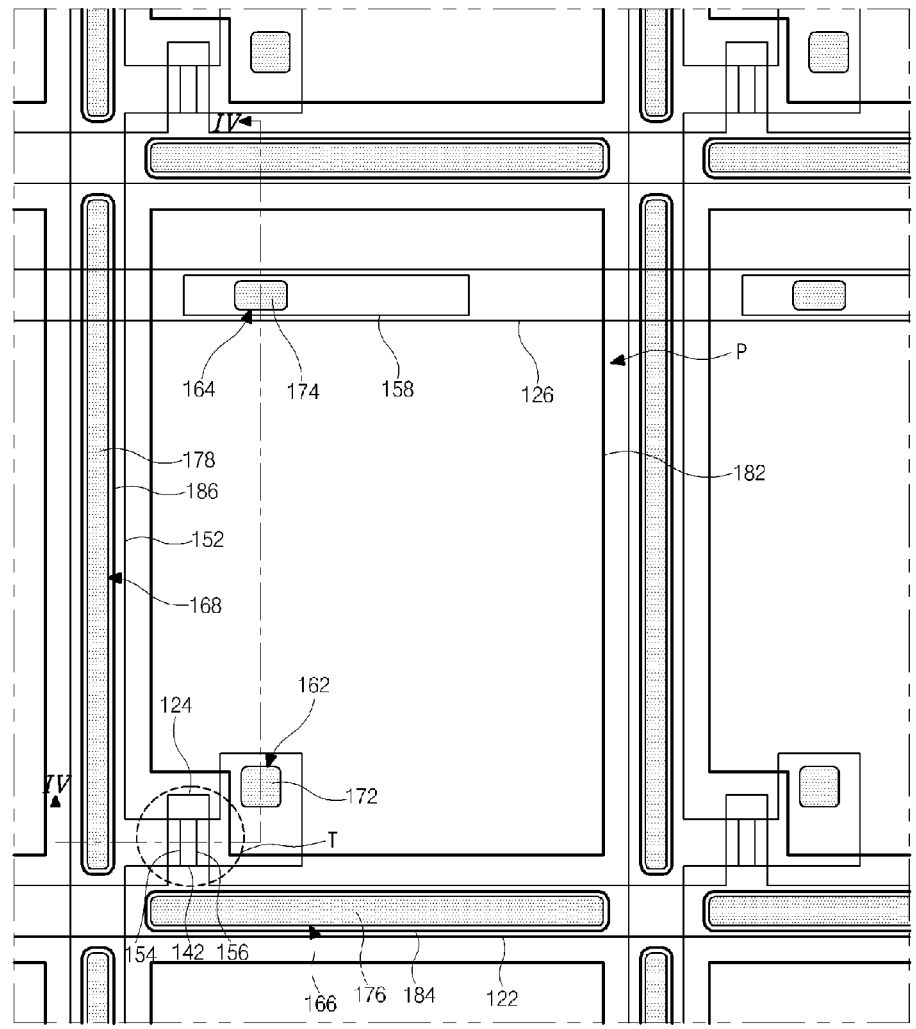
FIG. 3 is a plan view of illustrating an array substrate for a display device according to an exemplary embodiment of the present invention.
Figure 4:
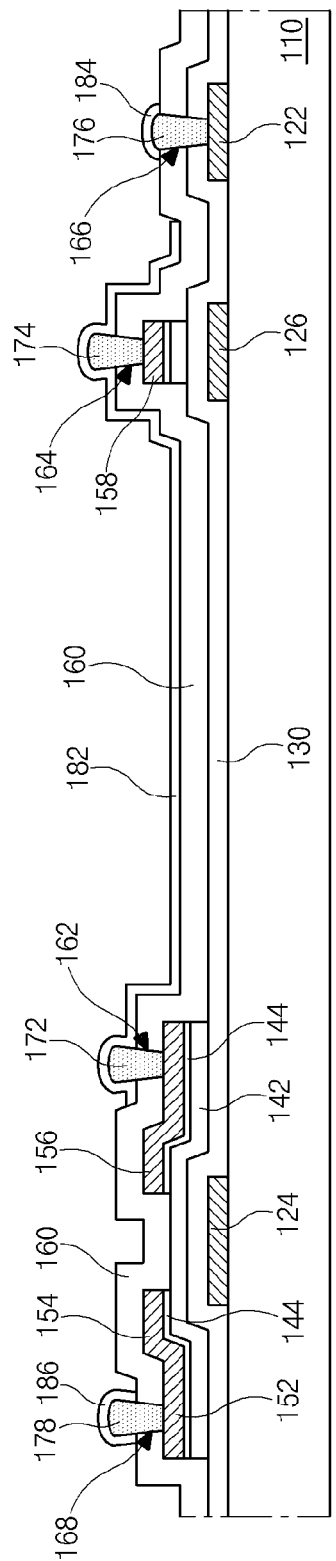
FIG. 4 is a cross-sectional view taken along the line IV-IV of FIG. 3.

FIG. 3 is a plan view of illustrating an array substrate for a display device according to an exemplary embodiment of the present invention. FIG. 4 is a cross-sectional view taken along the line IV-IV of FIG. 3.

In FIG. 3 and FIG. 4, a gate line 122 and a gate electrode 124 of a conductive material are formed on a transparent insulating substrate 110. The gate line 122 is formed along a first direction, and the gate electrode 124 extends from the gate line 122. A common line 126 is formed between adjacent gate lines 122 and is parallel to the gate line 122.

A gate insulating layer 130 of silicon nitride or silicon oxide is formed on the gate line 122, the gate electrode 124 and the common line 126 and covers the gate line 122, the gate electrode 124 and the common line 126.

An active layer 142 of intrinsic amorphous silicon is formed on the gate insulating layer 130 over the gate electrode 124. Ohmic contact layers 144 of impurity-doped amorphous silicon are formed on the active layer 142.

A data line 152, a source electrode 154 and a drain electrode 156 of a conductive material such as metal are formed on the ohmic contact layers 144. The data line 152 is formed along a second direction perpendicular to the first direction and crosses the gate line 122 and the common line 126. The data line 152 defines a pixel region P with the gate line 122. The source electrode 154 extends from the data line 152, and the drain electrode 156 is spaced apart from the source electrode 154 over the gate electrode 124. A capacitor electrode 158 is formed on the gate insulating layer 130 over the common line 126, and the capacitor electrode 158 is formed of the same material as the data line 152, the source electrode 154 and the drain electrode 156. Here, an intrinsic silicon pattern and an impurity-doped silicon pattern are formed under each of the data line 152 and the capacitor electrode 158.

The source and drain electrodes 154 and 156, the active layer 142 and the gate electrode 124 form a thin film transistor T, and the active layer 142 exposed between the source and drain electrodes 154 and 156 becomes a channel of the thin film transistor T. The capacitor electrode 158 and the common line 126 overlapping each other form a storage capacitor with the gate insulating layer 130 interposed therebetween as a dielectric substance.

A passivation layer 160 is formed on the data line 152, the source and drain electrodes 154 and 156 and the capacitor electrode 158. The passivation layer 160 is formed of inorganic insulating material such as silicon nitride and silicon oxide or organic insulating material such as acrylic resin. The passivation layer 160 includes a drain contact hole 162 exposing the drain electrode 156 and a capacitor contact hole 164 exposing the capacitor electrode 158. The passivation layer 160 further includes a first contact hole 166 exposing the gate line 122 along the first direction with the gate insulating layer 130 and a second contact hole 168 exposing the data line 152 along the second direction.

A drain contact pattern 172 is formed in the drain contact hole 162 and contacts the drain electrode 156. A capacitor contact pattern 174 is formed in the capacitor contact hole 164 and contacts the capacitor electrode 158. A first auxiliary gate pattern 176 is formed in the first contact hole 166 and contacts the gate line 122. A first auxiliary data pattern 178 is formed in the second contact hole 168 and contacts the data line 152.

The drain contact pattern 172, the capacitor contact pattern 174, the first auxiliary gate pattern 176 and the first auxiliary data pattern 178 are formed by a plating method and fill the contact holes 162, 164, 166 and 168, respectively. The drain contact pattern 172, the capacitor contact pattern 174, the first auxiliary gate pattern 176 and the first auxiliary data pattern 178 may have the same height as the passivation layer 160 or may be protruded over the passivation layer 160. The drain contact pattern 172, the capacitor contact pattern 174, the first auxiliary gate pattern 176 and the first auxiliary data pattern 178 may have the same thickness, and thus the drain contact pattern 172, the capacitor contact pattern 174 and the first auxiliary data pattern 178 may be protruded over the passivation layer 160 more than the first auxiliary gate pattern 176.

A pixel electrode 182 of a transparent conductive material is formed on the passivation layer 160 in the pixel region P. The pixel electrode 182 covers and contacts the drain contact pattern 172 and the capacitor contact pattern 174 and is electrically connected to the drain electrode 156 and the capacitor electrode 158. In addition, a second auxiliary gate pattern 184 and a second auxiliary data pattern 186 of the same material as the pixel electrode 182 are formed on the first auxiliary gate pattern 176 and the first auxiliary data pattern 178, respectively. The second auxiliary gate pattern 184 and the second auxiliary data pattern 186 cover, contact and protect the first auxiliary gate pattern 176 and the first auxiliary data pattern 178, respectively.

In the embodiment of the present invention, the first and second contact holes 166 and 168 exposing the gate line 122 and the data line 152, respectively, are formed when the drain contact hole 162 and the capacitor contact hole 164 are formed, and the first auxiliary gate pattern 176 and the first auxiliary data pattern 178 are formed in the first contact hole 166 and the second contact hole 168, respectively. Thus, the resistances of the gate line 122 and the data line 152 can be reduced. Accordingly, the signal delay can be prevented, and the load can be decreased. In addition, widths of the gate line 122 and the data line 152 can be reduced, and the aperture ratio and the brightness can be increased.

A method of manufacturing the array substrate will be described in detail with reference to FIGS. 5A to 5D, FIGS. 6A to 6F, FIG. 3 and FIG. 4. FIGS. 5A to 5D are plan views of illustrating an array substrate in respective steps of a method of manufacturing the same according to an exemplary embodiment of the present invention. FIGS. 6A to 6F are cross-sectional views of illustrating an array substrate in respective steps of the method of manufacturing the same according to the exemplary embodiment of the present invention and correspond to the lines VI-VI of FIGS. 5A to 5D.

Figure 5A:
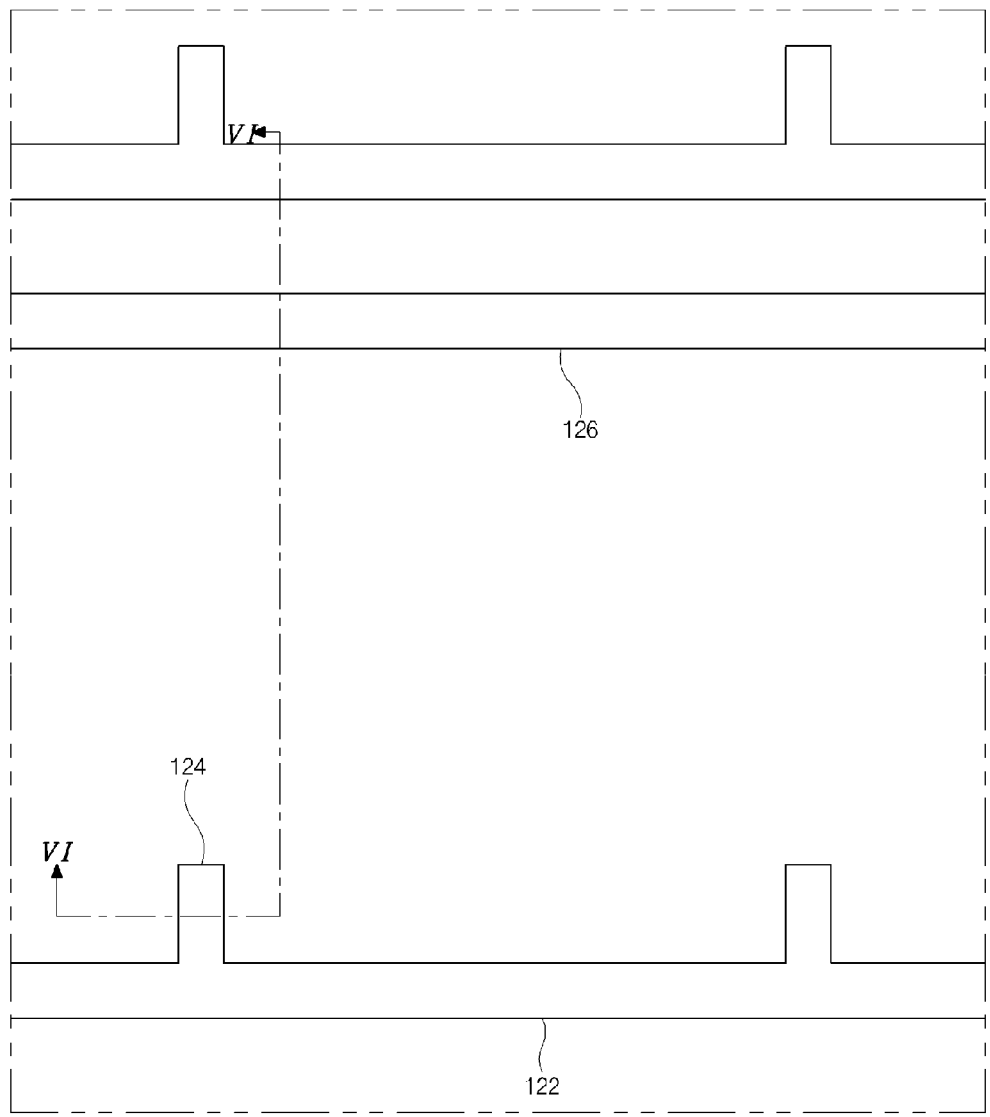
FIGS. 5A to 5D are plan views of illustrating an array substrate in respective steps of a method of manufacturing the same according to an exemplary embodiment of the present invention.
Figure 5B:
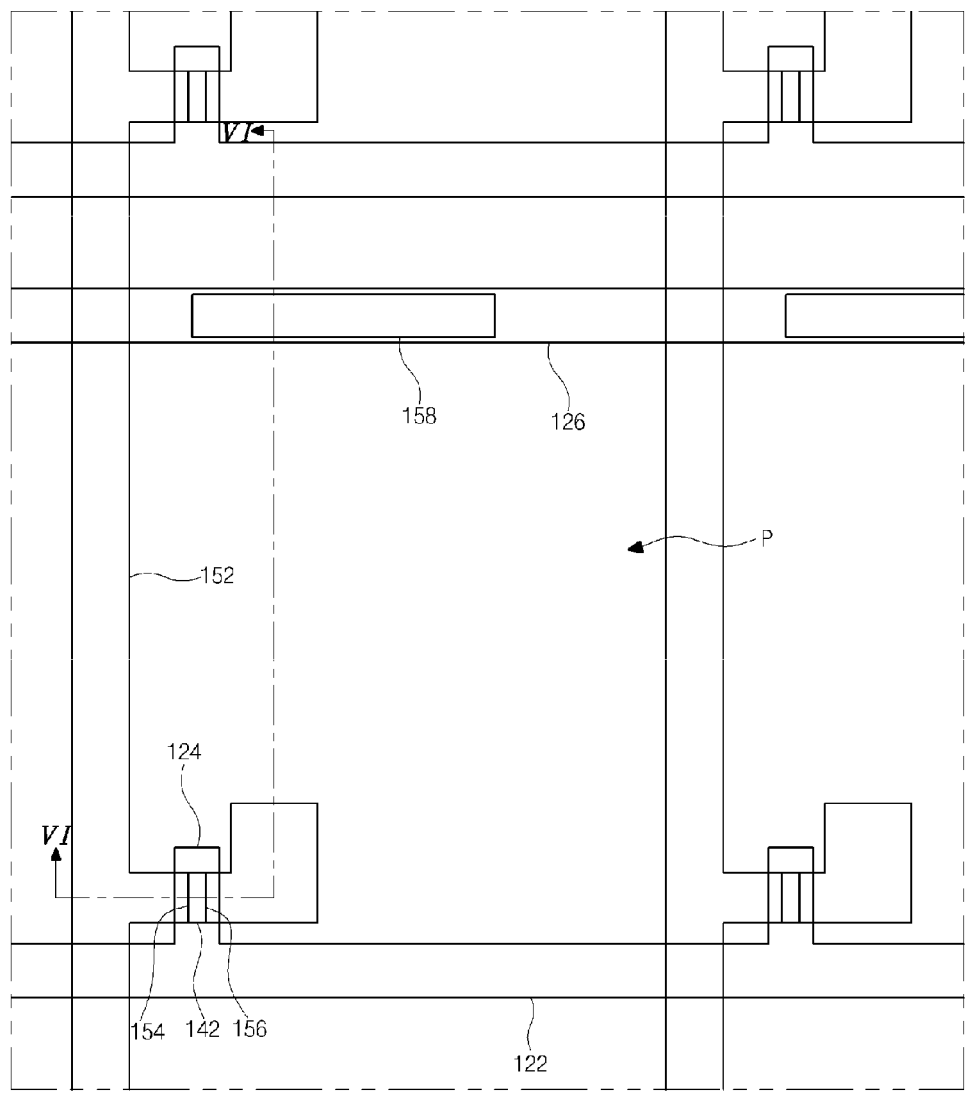

In FIG. 5A and FIG. 6A, a gate line 122, a gate electrode 124 and a common line 126 are formed on a transparent insulating substrate 110 such as glass or plastic by depositing a conductive material such as metal using a sputtering method and patterning the conductive material through a photolithographic process using a photo mask. The gate line 122 is formed along a first direction, and the common line 126 is disposed between adjacent gate lines 122 and parallel to the gate line 122. The gate electrode 124 extends from the gate line 122.

The gate line 122, the gate electrode 124 and the common line may be formed of aluminum, molybdenum, nickel, chromium, copper or alloys of them. Here, since copper has relatively low resistivity, it is more effective to use copper in lowering the resistance of the line and preventing the signal delay. When copper is used, a buffer layer may be formed under the copper layer to increase a surface property with the substrate 110. The buffer layer 110 may be formed of molybdenum, titanium, tantalum or alloys of them.

In FIG. 5B and FIGS. 6B to 6D, a gate insulating layer 130 is formed on the gate line 122, the gate electrode 124 and the common line 126, and then an active layer 142, ohmic contact layers 144, a data line 152, a source electrode 154, a drain electrode 156, and a capacitor electrode 158 are formed on the gate insulating layer 130 through a photolithographic process using a photo mask.

This will be described hereinafter in more detail.

In FIG. 6B, the gate insulating layer 130, an intrinsic silicon layer 140, an impurity-doped silicon layer 141 and a metallic layer 150 are sequentially formed on the gate line 122, the gate electrode 124 and the common line 126. Here, the gate insulating layer 130, the intrinsic silicon layer 140 and the impurity-doped silicon layer 141 may be formed by a chemical vapor deposition (CVD) method. The metallic layer 150 may be formed by a physical vapor deposition (PVD) method such as sputtering. The gate insulating layer 130 may be formed of silicon nitride (SiNx) or silicon oxide ($SiO_2$). The intrinsic silicon layer 140 may be formed of intrinsic amorphous silicon, and the impurity-doped silicon layer 141 may be formed of boron- or phosphorus-doped amorphous silicon. The metallic layer 150 may be formed of aluminum, molybdenum, nickel, chromium, copper or alloys of them. Here, since copper has relatively low resistivity, it is more effective to use copper in lowering the resistance of the line and preventing the signal delay. When copper is used, a buffer layer may be formed under the copper layer to increase a surface property with the substrate 110. The buffer layer 110 may be formed of molybdenum, titanium, tantalum or alloys of them.

A photoresist layer (not shown) is formed on the metallic layer 150 and a mask M is disposed over the photoresist layer. The mask M includes a light-blocking portion BA for blocking light, a light-transmitting portion TA for transmitting light, and a half light-transmitting portion HTA for partially transmitting light. The half light-transmitting portion HTA may include a plurality of slits or a semitransparent layer.

Next, light such as ultraviolet ray is irradiated to the photoresist layer through the mask M, and the photoresist layer is exposed to light. The light-exposed photoresist layer is developed to thereby form first and second photoresist patterns 192 and 194. The first photoresist pattern 192 corresponds to the light-blocking portion BA of the mask M and has a first thickness. The second photoresist pattern 194 corresponds to the half light-transmitting portion HTA and has a second thickness thinner than the first thickness. The second photoresist pattern 194 is disposed over the gate electrode 124, and the first photoresist pattern is disposed at both sides of the second photoresist pattern 194 and over the common line 126.

Figure 6C:
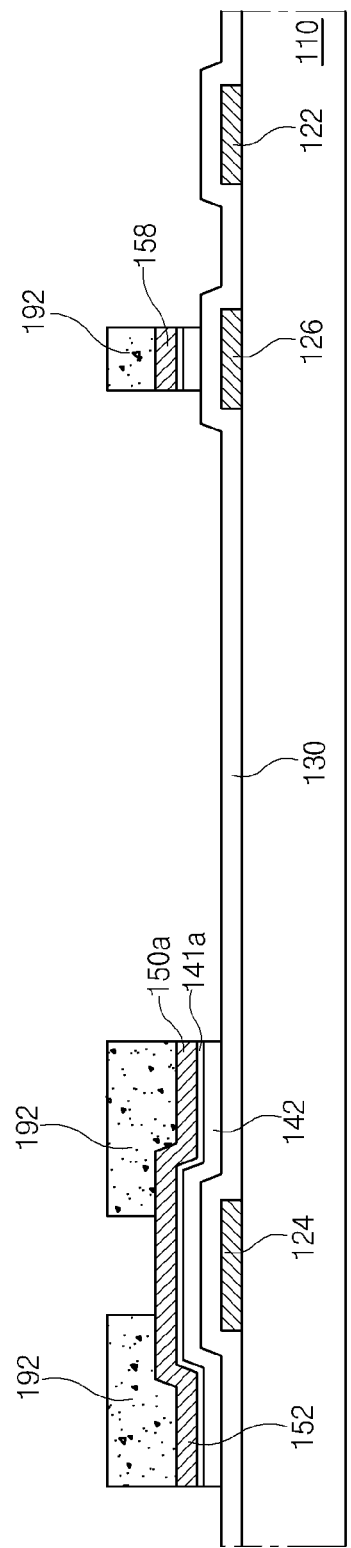

In FIG. 6C, the metallic layer 150 of FIG. 6B, the impurity-doped silicon layer 141 of FIG. 6B and the intrinsic silicon layer 140 of FIG. 6B are sequentially etched by using the first and second photoresist patterns 192 and 194 of FIG. 6B as an etching mask, thereby forming the data line 152, a source drain pattern 150a, an impurity-doped semiconductor pattern 141a, the active layer 142 and the capacitor electrode 158. Here, the metallic layer 150 of FIG. 6B may be wet-etched by an etchant, and the impurity-doped silicon layer 141 of FIG. 6B and the intrinsic silicon layer 140 of FIG. 6B may be dry-etched by etching gases.

The data line 152 is formed along a second direction perpendicular to the first direction and crosses the gate line 122 and the common line 126. The data line 152 and the gate line 122 define a pixel region P. The source drain pattern 150a is connected to the data line 152. The active layer 142, the impurity-doped semiconductor pattern 141a and the source drain pattern 150a are sequentially disposed over the gate electrode. The capacitor electrode 158 is disposed over the common line 126 and overlaps the common line 126. Here, an intrinsic silicon pattern and an impurity-doped silicon pattern are formed under each of the data line 152 and the capacitor electrode 158.

Then, the second photoresist pattern 194 of FIG. 6B is removed through an ashing process, thereby exposing the source drain pattern 150*a* over the gate electrode 124. At this time, the first photoresist pattern 192 is partially removed, and the thickness of the first photoresist pattern 192 is reduced.

Figure 6D:
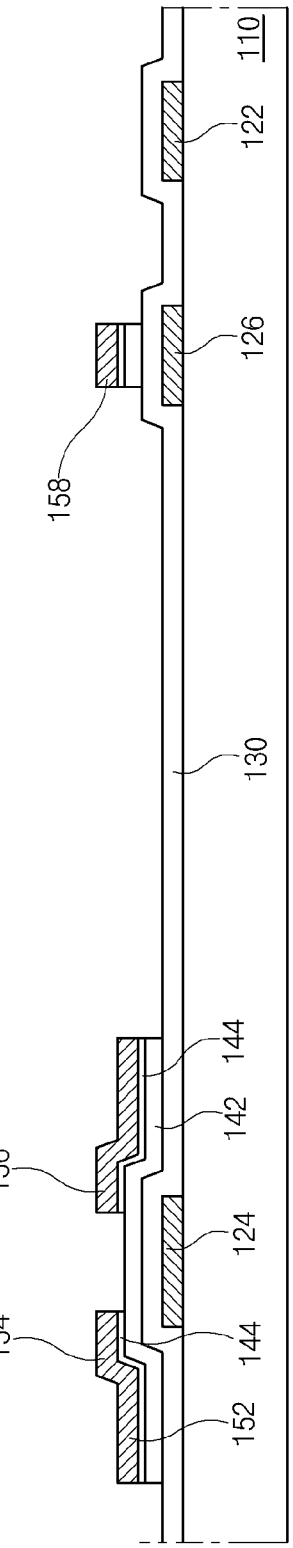

In FIG. 6D, the source drain pattern 150*a* of FIG. 6C and the impurity-doped semiconductor pattern 141*a* of FIG. 6C are etched by using the first photoresist pattern 192 of FIG. 6C as an etching mask, thereby forming the source and drain electrodes 154 and 156 and the ohmic contact layers 144 and exposing the active layer 142. The source electrode 154 is connected to the data line 152, and the drain electrode 156 faces and is spaced apart from gate electrode 154 with respect to the gate electrode 124.

Next, the first photoresist pattern 192 is removed.

Here, the active layer 142 is formed through the same photolithographic process as the data lie 152 and the source and drain electrodes 154 and 156. The active layer 142 may be formed through a different photolithographic process from the data lie 152 and the source and drain electrodes 154 and 156.

Figure 5C:
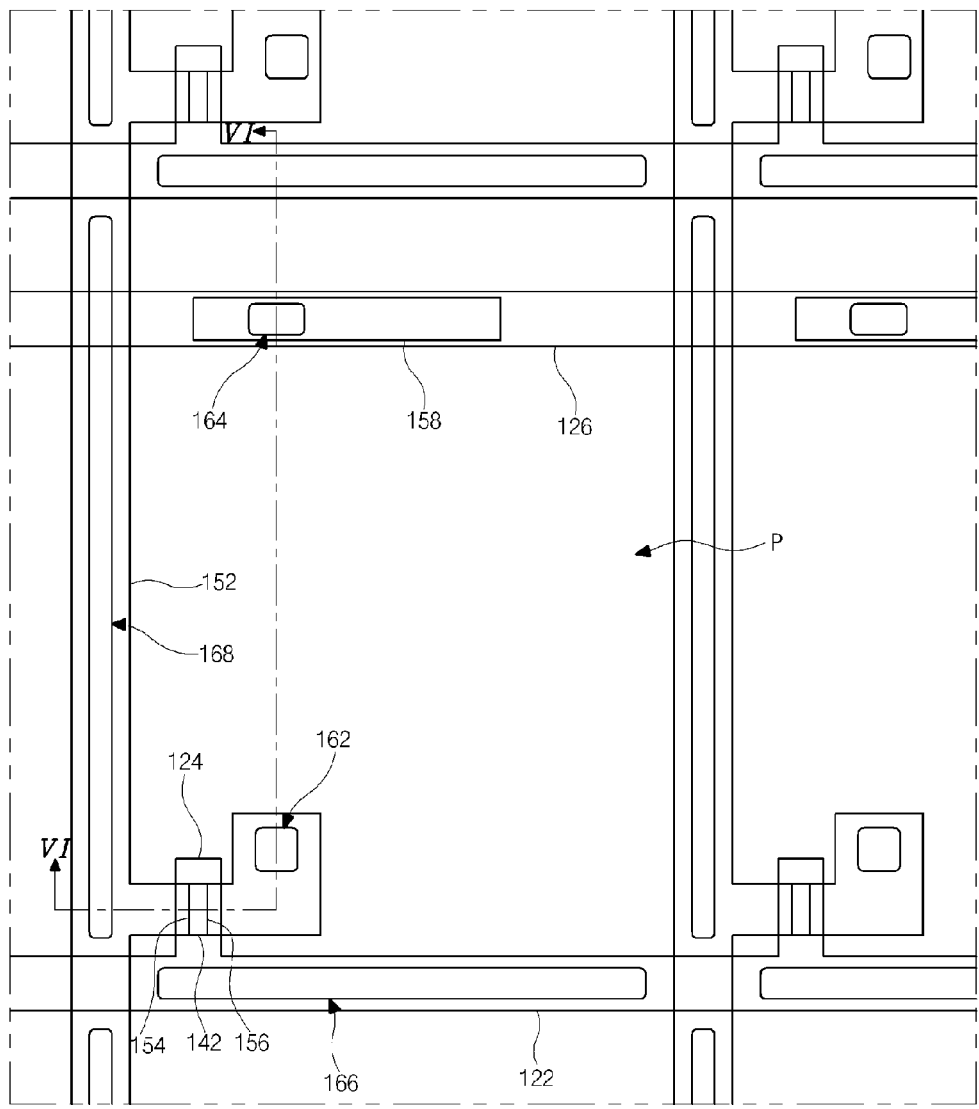
Figure 6E:
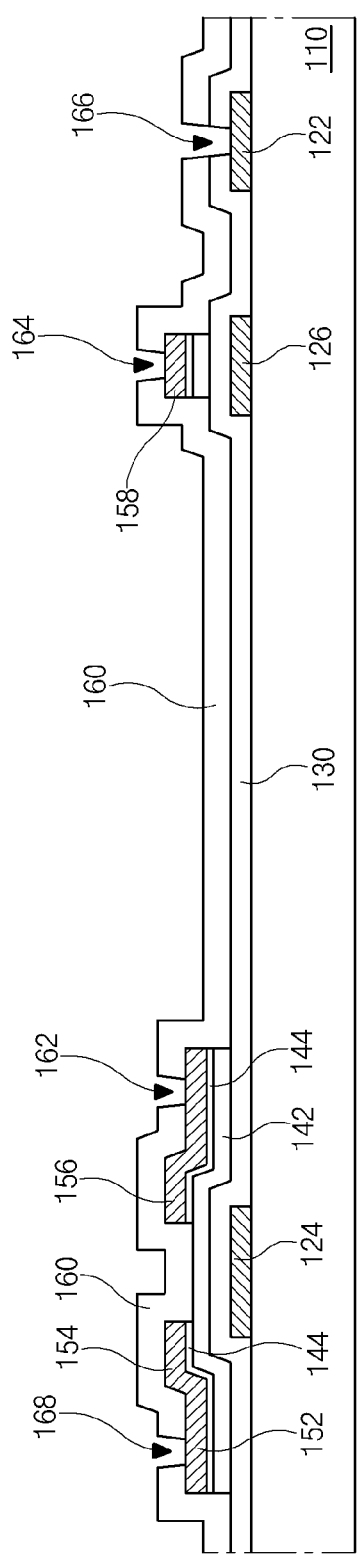

Then, in FIG. 5C and FIG. 6E, a passivation layer 160 is formed by depositing an inorganic insulating material such as silicon nitride or silicon oxide, and the passivation layer 160 is patterned through a photolithographic process using a photo mask, thereby forming a drain contact hole 162, a capacitor contact hole 164, a first contact hole 166 and a second contact hole 168. At this time, the gate insulating layer 130 corresponding to the first contact hole 166 is selectively removed, too. The drain contact hole 162 exposes the drain electrode 156, and the capacitor contact hole 164 exposes the capacitor electrode 158. The first contact hole 166 exposes the gate line 122 between adjacent data lines 152, and the second contact hole 168 exposes the data line 152 between adjacent gate lines 122.

Meanwhile, the passivation layer 160 may be formed of an organic insulating material such as acrylic resin, and in this case, the passivation layer 160 has a flat top surface.

Figure 5D:
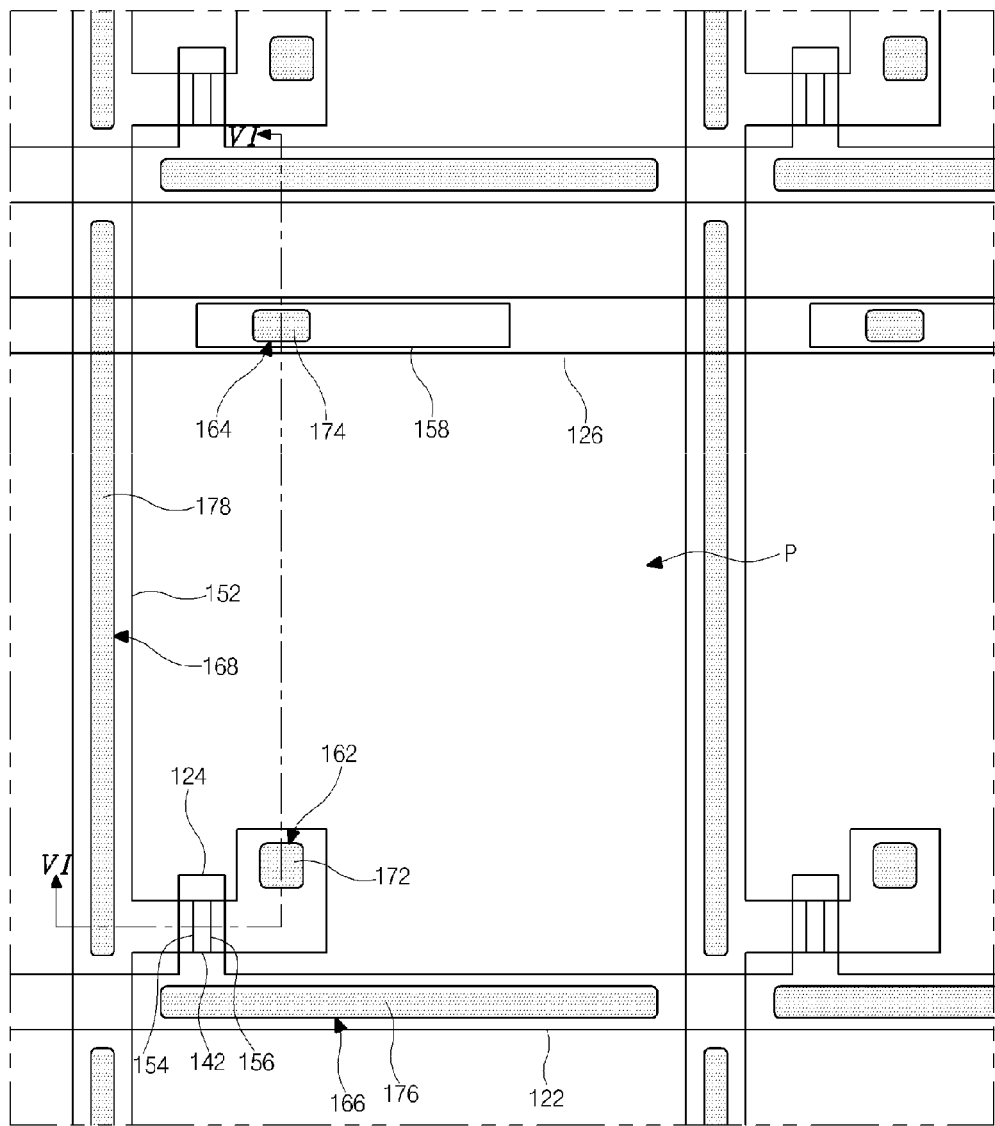
Figure 6F:
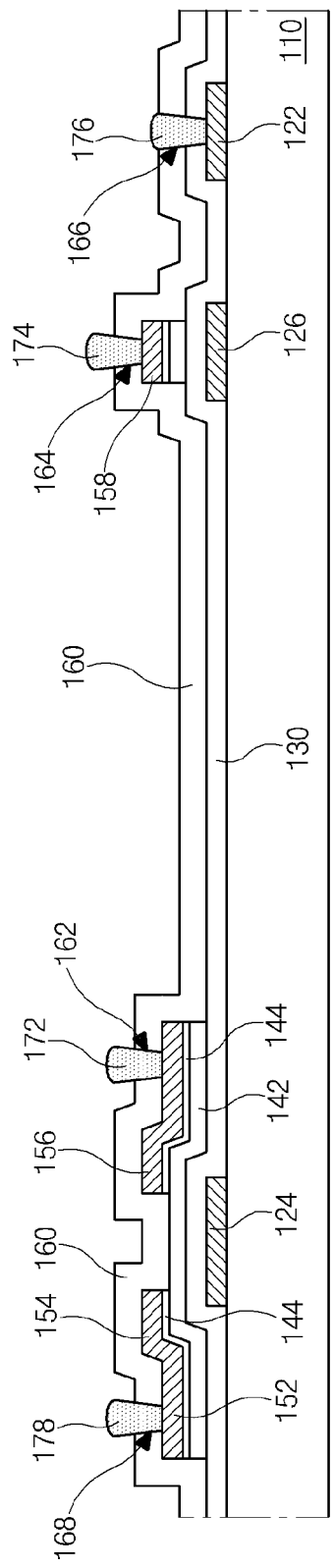

In FIG. 5D and FIG. 6F, a drain contact pattern 172, a capacitor contact pattern 174, a first auxiliary gate pattern 176 and a first auxiliary data pattern 178 are formed in the drain contact hole 162, the capacitor contact hole 164, the first contact hole 166 and the second contact hole 168, respectively, by a plating method. Here, the drain contact pattern 172, the capacitor contact pattern 174, the first auxiliary gate pattern 176 and the first auxiliary data pattern 178 may have a thickness of about 0.2 micrometer to about 5 micrometers. Beneficially, the drain contact pattern 172, the capacitor contact pattern 174, the first auxiliary gate pattern 176 and the first auxiliary data pattern 178 may have a thickness of about 2 micrometer to about 3 micrometers so as to reduce the resistance of the lines and prevent alignment problems of liquid crystal molecules due to steps of the patterns. The drain contact pattern 172, the capacitor contact pattern 174, the first auxiliary gate pattern 176 and the first auxiliary data pattern 178 may fill the drain contact hole 162, the capacitor contact hole 164, the first contact hole 166 and the second contact hole 168, respectively, and may be protruded over the passivation layer 160.

The drain contact pattern 172, the capacitor contact pattern 174, the first auxiliary gate pattern 176 and the first auxiliary data pattern 178 may be formed of a conductive material such as copper, chromium or nickel. The drain contact pattern 172, the capacitor contact pattern 174, the first auxiliary gate pattern 176 and the first auxiliary data pattern 178, beneficially, may be formed of copper to further decrease the resistance of the lines.

In the embodiment of the present invention, the second contact hole 168 is formed over the data line 152 between adjacent gate lines 122. The second contact hole 168 may be formed over the data line 152 crossing the gate line 122 and may be extended to a next pixel region P. Adjacent second contact holes 168 may be connected to each other. Thus, the first auxiliary data pattern 178 in the second contact hole 168 may be formed in one-united body along the data line 152, to further decrease the resistance of the lines. In other words, all the first auxiliary data patterns may be formed continuously along the data line.

The drain contact pattern 172, the capacitor contact pattern 174, the first auxiliary gate pattern 176 and the first auxiliary data pattern 178 may be formed by an electroless plating method, and this will be described later.

Next, in FIG. 3 and FIG. 4, a transparent conductive material is deposited and is patterned through a photolithographic process using a photo mask, thereby forming a pixel electrode 182, a second auxiliary gate pattern 184 and a second auxiliary data pattern 186. The pixel electrode 182 is disposed on the passivation layer 160 in the pixel region P. The pixel electrode 182 contacts and covers the drain contact pattern 172 and the capacitor contact pattern 174 and is electrically connected to the drain electrode 156 and the capacitor electrode 158. The second auxiliary gate pattern 184 contacts and covers the first auxiliary gate pattern 176, and the second auxiliary data pattern 186 contacts and covers the first auxiliary data pattern 178. The transparent conductive material may be indium tin oxide or indium zinc oxide.

The second auxiliary gate pattern 184 and the second auxiliary data pattern 186 prevent oxidation of the first auxiliary gate pattern 176 and the first auxiliary data pattern 178 and protect the first auxiliary gate pattern 176 and the first auxiliary data pattern 178.

Figure 7:
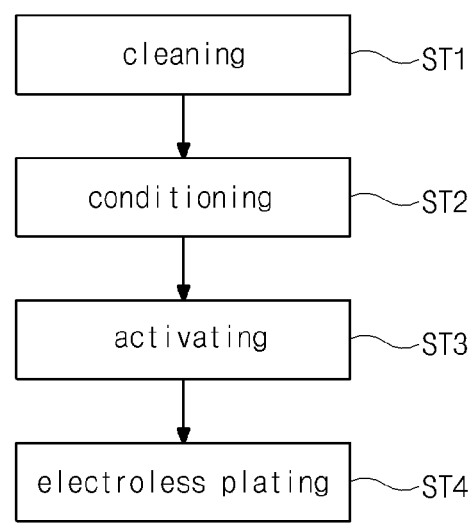
FIG. 7 is a flow chart of illustrating processes of an electroless plating method according to the present invention.

An electroless plating method according to the present invention will be described with reference to FIG. 7. FIG. 7 is a flow chart of illustrating processes of an electroless plating method according to the present invention. A method of plating copper will be explained as an example.

In FIG. 7, at a first step ST1, to increase adhesion between a base layer and a plating layer, a cleaning process is performed, and particles or organic materials are removed, thereby cleaning a surface of the base layer. At this time, a substrate including the base layer thereon may be exposed to an organic solution for about 30 seconds, and the base layer may include copper.

Then, at a second step ST2, a conditioning process is performed, and an oxide film on the base layer is removed. The surface of the base layer has a polarity, for example, a positive (+) polarity. At this time, the substrate including the base layer thereon may be exposed to a solution including sulfuric acid ($H_2SO_4$) for about 30 seconds. Here, the second step ST2 may be omitted.

Next, at a third step ST3, an activating process is performed, and palladium (Pd) is adsorbed to the surface of the base layer. The palladium functions as a catalyst. The substrate including the base layer thereon is exposed to an acid solution in which palladium ions are melted for about 60 seconds. Copper of the base layer loses electrons due to a catalytic property of the substitution-type palladium ion and becomes an ion. The palladium ion is reduced and adsorbed to the surface of the base layer. Here, the acid solution may be a sulfuric acid ($H_2SO_4$) base solution.

At a fourth step ST4, an electroless plating process is performed, and a copper plating layer is formed on the base layer. At this time, a copper plating solution is used. The copper plating solution includes metallic salts, a reducing agent, a complexant, a stabilizer and an exaltant (or accelerator) and is alkali.

The reducing agent provides the copper ion with electrons. The potential of the reducing agent may be lower than the equilibrium potential of the copper ion. The reducing agent may include one of formaldehyde, dimethylamine borane (DMAD) and sodium hypophosphite. For example, when formaldehyde is used as the reducing agent, hydrogen ions (H+) and hydroxide ions (OH−) may be generated due to a reducing process of formaldehyde, and pH of the plating solution may be changed.

The complexant is combined with the copper ion and prevents the copper ion from reacting with the reducing agent and being precipitated. The complexant may include one of sodium potassium tartrate, which may be referred to as Rochelle salt, ethylenediamine tetraacetic acid (EDTA), glycolic acid and triethanol amine.

The stabilizer is adsorbed to dusts or copper particles and prevents the copper ion from contacting the reducing agent. The stabilizer may include one of oxygen, thiourea, 2-mercaptobenzothiazole, diethyldithiocarbamate and vanadium pentoxide.

The exaltant (or accelerator) is to increase a plating speed. The exaltant may include one of cyanide, proprionitrile, O-phenanthroline.

Therefore, when the substrate including the base layer to which palladium is adsorbed is exposed to the copper plating solution, electrons are generated due to the reducing process of the reducing agent, and the copper ion is combined with the electrons and is educed on the palladium catalyst, thereby forming the copper plating layer. In addition, the plated copper functions as an autocatalytic, and the copper plating layer is further formed.

Here, a thickness of the copper plating layer varies depending on components, component ratios and exposing time of the copper plating solution. For example, when the base layer is exposed to the copper plating solution including formaldehyde, Rochelle salt and 2-mercaptobenzothiazole for about 1,200 seconds, a copper plating layer of about 1.5 micrometers may be formed.

In the embodiment of the present invention, the first auxiliary gate pattern 176 and the first auxiliary data pattern 178 are formed by the electroless plating method. The first auxiliary gate pattern 176 and the first auxiliary data pattern 178 may be formed by an electro plating method. More particularly, to prevent static electricity during manufacturing the array substrate and to inspect an electrical condition after manufacturing the array substrate, shorting bars connecting the gate lines and the data lines are formed. The first auxiliary gate pattern 176 and the first auxiliary data pattern 178 may be formed by an electro plating method using the shorting bars.

In the embodiment of the present invention, the first auxiliary gate pattern 176 and the first auxiliary data pattern 178 are formed on the gate line 122 and the data line 152, respectively, by a plating method. The resistances of the gate line 122 and the data line 152 are reduced, and the signal delay is prevented. The loads to the lines can be decreased. At this time, since widths of the gate line 122 and the data line 152 can be reduced and the pixel region P can be enlarged, the aperture ratio and the brightness may be improved. The improvement of the aperture ratio depends on the size and resolution of the display device. In comparison with the related art, the aperture ratio may be increased by about 10% to about 50%, and the aperture ratio may be further improved as the resolution of the display device gets high.

Since the auxiliary patterns 176 and 178 are simultaneously formed by the plating method after exposing the gate line 122 and the data line 152 when the drain and capacitor contact holes 162 and 164 are formed, the process may be simplified, and the manufacturing costs and time can be reduced as compared with the case of separately plating the gate line 122 and the data line 152.

Moreover, if the gate line 122 and the data line 152 are separately plated, the gate line 122 and the data line 152 at a crossing portion thereof are plated twice, and there is a relatively high step at the crossing portion. Thus, the layers formed on the crossing portion may be disconnected due to the step. However, in the present invention, since the gate line 122 is not plated at the crossing portion, the layers formed on the crossing portion can be prevented from being disconnected. Furthermore, if the gate line 122 and the data line 152 are separately plated, the electrodes of the thin film transistor T may be plated, and there may be problems such as degradation of the thin film transistor T. However, in the present invention, the electrodes of the thin film transistor T are not plated, and the problems can be prevented.

Meanwhile, if sides of the contact holes 162, 164, 166 and 168 are reversely tapered when the contact holes 162, 164, 166 and 168 are formed by patterning the passivation layer 160, a layer formed later may be disconnected due to a reversely-tapered step. However, in the present invention, the metallic patterns are formed in the contact holes 162, 164, 166 and 168 by a plating method. Thus, even though the sides of the contact holes 162, 164, 166 and 168 are reversely tapered, disconnection of the layers formed later can be prevented.

In the above embodiment, the first auxiliary gate pattern 176 and the first auxiliary data pattern 178 have a single-layered structure. The first auxiliary gate pattern 176 and the first auxiliary data pattern 178 may have a multiple-layered structure by plating different materials. Specially, when the first auxiliary gate pattern 176 and the first auxiliary data pattern 178 include copper, a nickel plating layer may be further formed on the copper plating layer in order to prevent oxidation and lower a contact resistance with a following layer.

Figure 8:
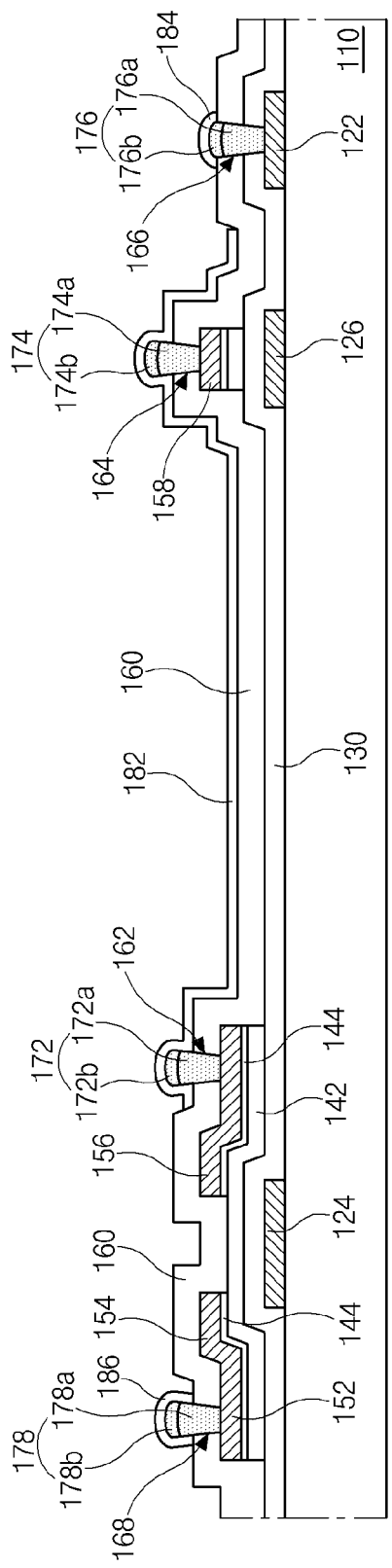
FIG. 8 is a cross-sectional view of illustrating another array substrate for a display device according to an exemplary embodiment of the present invention.

This will be described with reference to FIG. 8. FIG. 8 is a cross-sectional view of illustrating another array substrate for a display device according to an exemplary embodiment of the present invention. The same reference numbers will be used to refer to the same parts as the above embodiment, and explanations for the same parts will be omitted.

In FIG. 8, each of the first auxiliary gate pattern 176 and the first auxiliary data pattern 178 includes a first plating layer 176a or 178a and a second plating layer 176b or 178b. The second plating layer 176b or 178b has a thinner thickness than the first plating layer 176a or 178a. Here, the drain contact pattern 172 and the capacitor contact pattern 174 also have a double-layered structure of a first plating layer 172a or 174a and a second plating layer 172b or 174b.

For example, the first plating layers 172a, 174a, 176a and 178a are formed by plating copper, and the second plating layers 172b, 174b, 176b and 178b are formed by plating nickel. The second plating layers 172b, 174b, 176b and 178b prevent the first plating layers 172a, 174a, 176a and 178a from being oxidized and reduce contact resistances between the first plating layer 172a, 174a, 176a or 178a and one of the pixel electrode 182, the second auxiliary gate pattern 184 and the second auxiliary data pattern 186.

The first plating layers 172a, 174a, 176a and 178a may have a thickness greater than or equal to about 0.2 micrometers and smaller than or equal to about 5 micrometers, and beneficially, greater than or equal to about 2 micrometers and smaller than or equal to about 3 micrometers. The second plating layers 172b, 174b, 176b and 178b may have a thickness greater than or equal to about 0.02 micrometers and smaller than or equal to about 0.1 micrometers.

In the above embodiment of the present invention, the common line and the capacitor electrode overlapping each other constitute the storage capacitor. Alternatively, the structure of the storage capacitor may be changed, and this will be explained with reference to FIG. 9 and FIG. 10.

Figure 9:
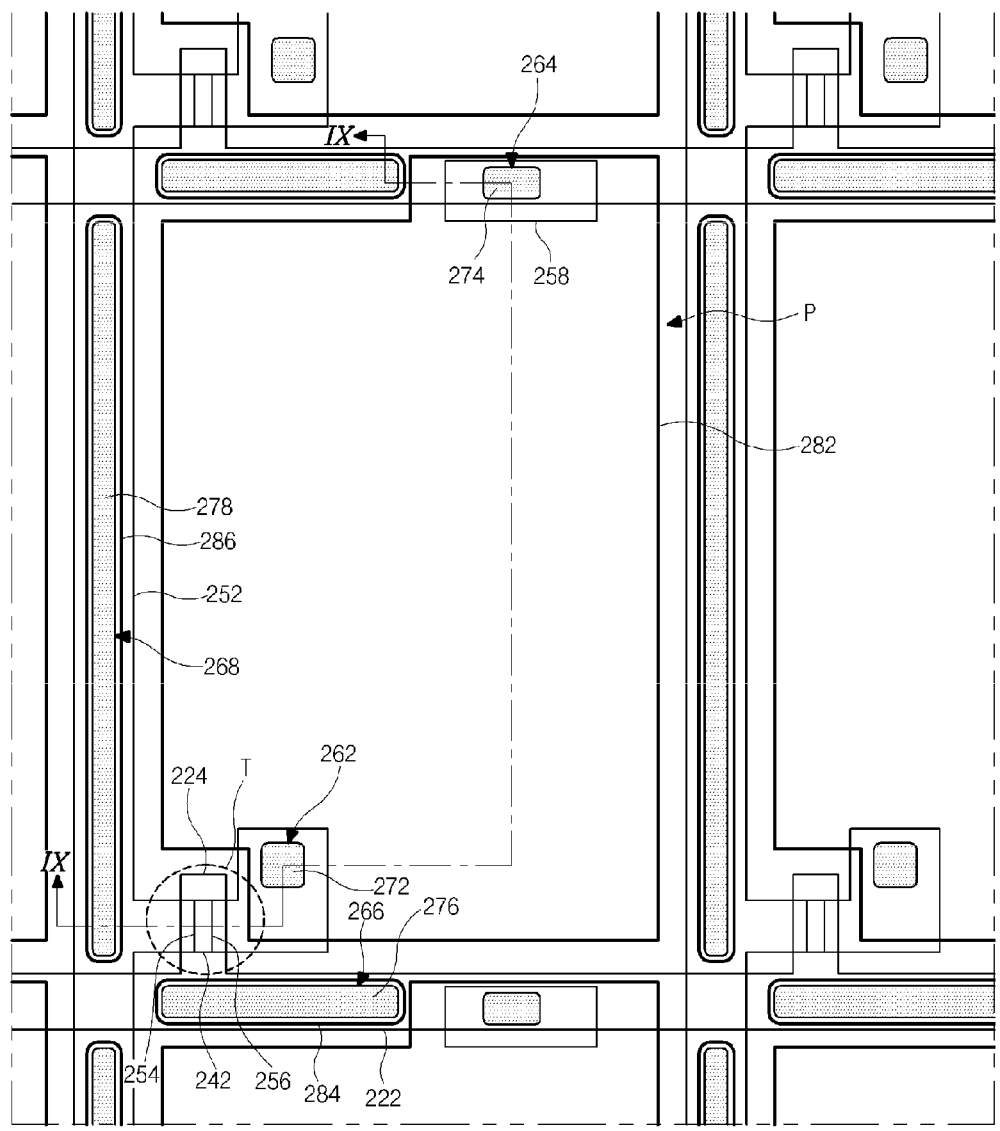
FIG. 9 is a plan view of illustrating an array substrate for a display device according to another embodiment of the present invention.
Figure 10:
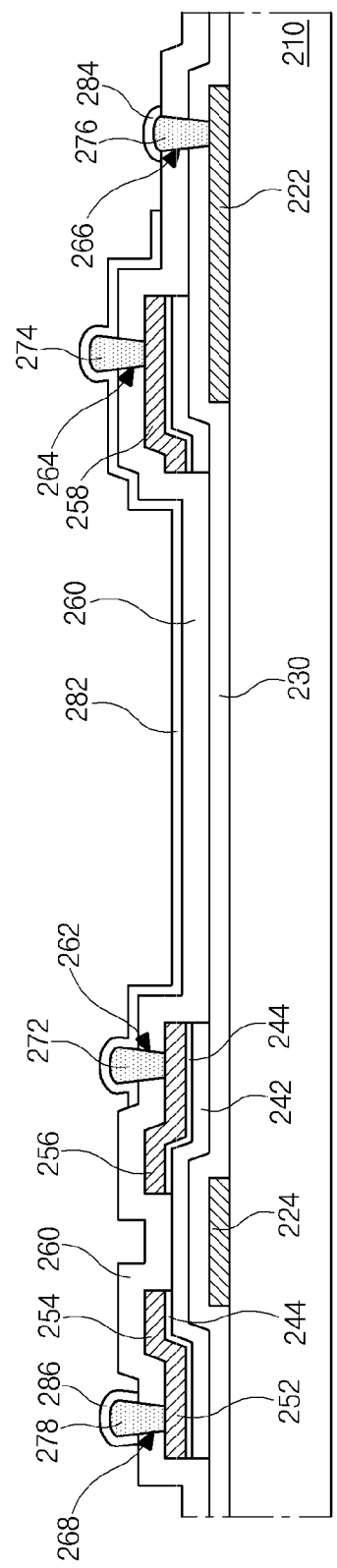
FIG. 10 is a cross-sectional view taken along the line IX-IX of FIG. 9.

FIG. 9 is a plan view of illustrating an array substrate for a display device according to another embodiment of the present invention. FIG. 10 is a cross-sectional view taken along the line IX-IX of FIG. 9.

In FIG. 9 and FIG. 10, a gate line 222 and a gate electrode 224 of a conductive material are formed on a transparent insulating substrate 210. The gate line 222 is formed along a first direction, and the gate electrode 224 extends from the gate line 222.

A gate insulating layer 230 of silicon nitride or silicon oxide is formed on the gate line 222 and the gate electrode 224 and covers the gate line 222 and the gate electrode 224.

An active layer 242 of intrinsic amorphous silicon is formed on the gate insulating layer 230 over the gate electrode 224. Ohmic contact layers 244 of impurity-doped amorphous silicon are formed on the active layer 242.

A data line 252, a source electrode 254 and a drain electrode 256 of a conductive material such as metal are formed on the ohmic contact layers 244. The data line 252 is formed along a second direction perpendicular to the first direction and crosses the gate line 222 to define a pixel region P. The source electrode 254 extends from the data line 252, and the drain electrode 256 faces and is spaced apart from the source electrode 254 over the gate electrode 224. A capacitor electrode 258 is formed on the gate insulating layer 230 over a first part of the gate line 222, and the capacitor electrode 258 is formed of the same material as the data line 252, the source electrode 254 and the drain electrode 256. Here, an intrinsic silicon pattern and an impurity-doped silicon pattern are formed under each of the data line 252 and the capacitor electrode 258.

The source and drain electrodes 254 and 256, the active layer 242 and the gate electrode 224 form a thin film transistor T, and the active layer 242 exposed between the source and drain electrodes 1254 and 256 becomes a channel of the thin film transistor T. The capacitor electrode 258 and the gate line 222 overlapping each other form a storage capacitor with the gate insulating layer 230 interposed therebetween as a dielectric substance.

A passivation layer 260 is formed on the data line 252, the source and drain electrodes 254 and 256 and the capacitor electrode 258. The passivation layer 260 is formed of inorganic insulating material such as silicon nitride and silicon oxide or organic insulating material such as acrylic resin. The passivation layer 260 includes a drain contact hole 262 exposing the drain electrode 256 and a capacitor contact hole 264 exposing the capacitor electrode 258. The passivation layer 260 further includes a first contact hole 266 exposing a second part of the gate line 222 with the gate insulating layer 230 and a second contact hole 268 exposing the data line 252.

A drain contact pattern 272 is formed in the drain contact hole 262 and contacts the drain electrode 256. A capacitor contact pattern 274 is formed in the capacitor contact hole 264 and contacts the capacitor electrode 258. A first auxiliary gate pattern 276 is formed in the first contact hole 266 and contacts the gate line 222. A first auxiliary data pattern 278 is formed in the second contact hole 268 and contacts the data line 252.

The drain contact pattern 272, the capacitor contact pattern 274, the first auxiliary gate pattern 276 and the first auxiliary data pattern 278 are formed by a plating method and fill the contact holes 262, 264, 266 and 268, respectively. The drain contact pattern 272, the capacitor contact pattern 274, the first auxiliary gate pattern 276 and the first auxiliary data pattern 278 may have the same height as the passivation layer 260 or may be protruded over the passivation layer 260. The drain contact pattern 272, the capacitor contact pattern 274, the first auxiliary gate pattern 276 and the first auxiliary data pattern 278 may have the same thickness, and thus the drain contact pattern 272, the capacitor contact pattern 274 and the first auxiliary data pattern 278 may be protruded over the passivation layer 260 more than the first auxiliary gate pattern 276.

A pixel electrode 282 of a transparent conductive material is formed on the passivation layer 260 in the pixel region P. The pixel electrode 282 covers and contacts the drain contact pattern 272 and the capacitor contact pattern 274 and is electrically connected to the drain electrode 256 and the capacitor electrode 258. In addition, a second auxiliary gate pattern 284 and a second auxiliary data pattern 286 of the same material as the pixel electrode 282 are formed on the first auxiliary gate pattern 276 and the first auxiliary data pattern 278, respectively. The second auxiliary gate pattern 284 and the second auxiliary data pattern 286 cover, contact and protect the first auxiliary gate pattern 276 and the first auxiliary data pattern 278, respectively.

Meanwhile, the capacitor electrode 258 may be omitted, and in this case, the pixel electrode 282 may overlap the gate line 222 to form a storage capacitor.

The array substrate according to another embodiment of the present invention may be manufactured through the processes of FIGS. 5A to 5D, FIGS. 6A to 6F, FIG. 3 and FIG. 4.

In the array substrate and the method of manufacturing the same according to the present invention, the auxiliary patterns are formed on the gate line and the data line. Thus, the resistances of the lines can be reduced, and the signal delay can be prevented. The load to the lines can be decreased. In addition, the widths of the lines can be reduced, and the aperture ratio and the brightness can be increased. At this time, the auxiliary patterns can be simultaneously formed on the gate line and the data line by a plating process, and the process is simplified. The manufacturing costs and time can be decreased.

Meanwhile, the gate line is not plated at the crossing portion of the gate line and the data line, and the layers formed over the crossing portion can be prevented from being disconnected. Moreover, the electrodes of the thin film transistor are not plated. Thus, the thin film transistor can be prevented from being degraded.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:
1. An array substrate for a display device, comprising:
a substrate;
a gate line formed on the substrate along a first direction;
a data line formed over the substrate along a second direction, wherein the data line and the gate line cross each other to define a pixel region;

a thin film transistor formed in the pixel region, and having a gate electrode connected to the gate line, a source electrode connected to the data line, and a drain electrode;

a passivation layer on the drain electrode and comprising a drain contact hole;

a drain contact pattern formed in the drain contact hole and contacting the drain electrode, wherein an outermost boundary of the drain contact pattern is disposed within an outermost boundary of the drain electrode;

a pixel electrode formed in the pixel region and connected to the drain electrode, wherein the pixel electrode covers and contacts the drain contact pattern such that the drain contact pattern is disposed between the drain electrode and the pixel electrode;

a first auxiliary gate pattern formed over the gate line and contacting the gate line; and a first auxiliary data pattern formed over the data line and contacting the data line.

2. The array substrate for a display device of claim 1, wherein the first auxiliary gate pattern and the first auxiliary data pattern are formed by a plating method.

3. The array substrate for a display device of claim 1, wherein the first auxiliary gate pattern and the first auxiliary data pattern are formed of copper, chromium or nickel.

4. The array substrate for a display device of claim 1, wherein the first auxiliary data pattern is formed in one-united body along the data line.

5. The array substrate for a display device of claim 1, wherein each of the first auxiliary gate pattern and the first auxiliary data pattern includes a first plating layer of copper and a second plating layer of nickel on the first plating layer, and the second plating layer is thinner than the first plating layer.

6. The array substrate for a display device of claim 1, further comprising:
a second auxiliary gate pattern formed on the first auxiliary gate pattern to cover, contact and protect the first auxiliary gate pattern; and
a second auxiliary data pattern formed on the first auxiliary data pattern to cover, contact and protect the first auxiliary data pattern.

7. The array substrate for a display device of claim 6, wherein the second auxiliary gate pattern and the second auxiliary data pattern are formed of the same material as the pixel electrode.

8. The array substrate for a display device of claim 1, wherein the gate line includes a first part and a second part in the pixel region, and wherein the pixel electrode overlaps the first part of the gate line and the first auxiliary gate pattern contacts the second part of the gate line.

9. The array substrate for a display device of claim 8, further comprising:
a capacitor electrode over the first part of the gate electrode; and
a capacitor contact pattern on the capacitor electrode,
wherein the passivation layer is further formed on the capacitor electrode and comprises a capacitor contact hole, the capacitor contact pattern is formed in the capacitor contact hole and contacts the capacitor electrode, and the pixel electrode covers and contacts the capacitor contact pattern.

10. The array substrate for a display device of claim 9, wherein the first auxiliary gate pattern, the first auxiliary data pattern and the capacitor contact pattern are formed by a plating method.

11. The array substrate for a display device of claim 1, further comprising:
a gate insulating layer covering the gate line and the gate electrode, and being below the data line;
the passivation layer formed on the data line and the gate insulating layer;
a first contact hole formed in the passivation layer and the gate insulating layer, and exposing the gate line along the first direction; and
a second contact hole formed in the passivation layer, and exposing the data line along the second direction,
wherein the first auxiliary gate pattern is formed in the first contact hole; and the first auxiliary data pattern is formed in the second contact hole.

12. The array substrate for a display device of claim 11, wherein the drain contact pattern, the first auxiliary gate pattern and the first auxiliary data pattern are formed by a plating method.

13. The array substrate for a display device of claim 11, wherein the drain contact pattern, the first auxiliary gate pattern and the first auxiliary data pattern are formed of copper, chromium or nickel.

14. The array substrate for a display device of claim 11, further comprising:
a common line formed between adjacent gate lines and parallel to the gate line, wherein the gate insulating layer further covers the common line;
a capacitor electrode formed over the common line, wherein the capacitor electrode and the common line overlapping each other form a storage capacitor with the gate insulating layer interposed therebetween; and
a capacitor contact pattern,
wherein the passivation layer is further formed on the capacitor electrode and comprises a capacitor contact hole, the capacitor contact pattern is formed in the capacitor contact hole and contacts the capacitor electrode, and the pixel electrode covers and contacts the capacitor contact pattern.

15. The array substrate for a display device of claim 14, wherein the drain contact pattern, the first auxiliary gate pattern, the first auxiliary data pattern and the capacitor contact pattern are formed by a plating method.

16. The array substrate for a display device of claim 14, wherein the drain contact pattern, the first auxiliary gate pattern, the first auxiliary data pattern and the capacitor contact pattern are formed of copper, chromium or nickel.

* * * * *